United States Patent [19]

Miyajima et al.

[11] Patent Number: 5,030,582
[45] Date of Patent: Jul. 9, 1991

[54] METHOD OF FABRICATING A CMOS SEMICONDUCTOR DEVICE

[75] Inventors: Akio Miyajima; Keiichi Kagawa; Akihira Shinohara; Kiyoyuki Morita; Takashi Uehara, all of Osaka, Japan

[73] Assignee: Matsushita Electric Industrial Co., Ltd., Osaka, Japan

[21] Appl. No.: 418,039

[22] Filed: Oct. 6, 1989

[30] Foreign Application Priority Data

Oct. 14, 1988 [JP] Japan ............................. 63-260057
Mar. 22, 1989 [JP] Japan ................................. 1-69629

[51] Int. Cl.$^5$ ............................................. H01L 21/336
[52] U.S. Cl. ........................................ 437/34; 437/44; 437/45; 437/57
[58] Field of Search ............ 437/41, 44, 45, 42, 437/43, 56, 57, 58, 59, 34, 238, 239, 229; 357/42

[56] References Cited

U.S. PATENT DOCUMENTS

| | | | |
|---|---|---|---|
| 4,366,613 | 1/1983 | Ogura et al. | 437/978 |
| 4,419,809 | 12/1983 | Rifeman et al. | 437/41 |
| 4,422,885 | 12/1983 | Brower et al. | 437/45 |
| 4,477,310 | 10/1984 | Park et al. | 437/200 |
| 4,603,472 | 8/1986 | Schwabe et al. | 437/42 |
| 4,665,414 | 5/1987 | Koeneke et al. | 357/15 |
| 4,703,551 | 11/1987 | Szluk et al. | 437/57 |
| 4,771,014 | 9/1988 | Liou et al. | 437/41 |
| 4,786,609 | 11/1988 | Chen | 437/30 |
| 4,795,718 | 1/1989 | Beitman | 437/41 |
| 4,891,326 | 1/1990 | Koyanagi | 437/41 |
| 4,902,634 | 2/1990 | Picco | 437/56 |

FOREIGN PATENT DOCUMENTS

82/02283 7/1982 World Int. Prop. O. .

Primary Examiner—Olik Chaudhuri
Assistant Examiner—T. N. Quach
Attorney, Agent, or Firm—Pollock, VandeSande & Priddy

[57] ABSTRACT

An ion implantation stopper is formed on a gate electrode extending on a substrate. When ions are implanted into the substrate to form an LDD layer or source and drain regions in the substrate, the stopper functions to prevent the gate electrode from being exposed to ion implantation. The prevention of the exposure of the gate electrode to the ion implantation ensures the prevention of channeling in the gate electrode.

7 Claims, 14 Drawing Sheets

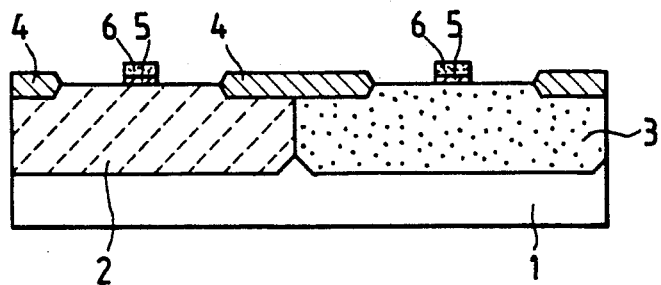
FIG.(a)
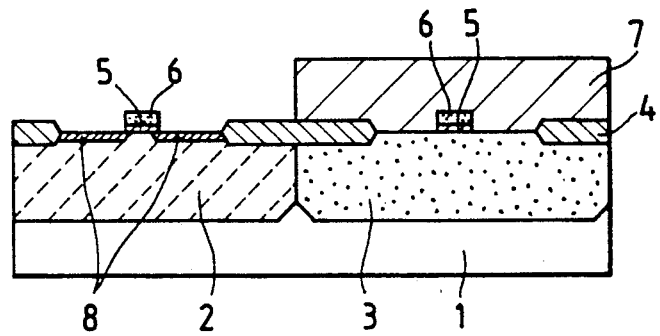
FIG.(b)
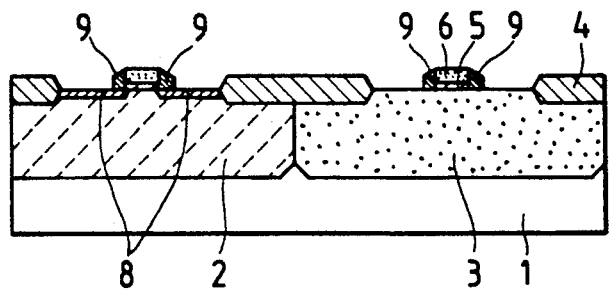
FIG.(c)

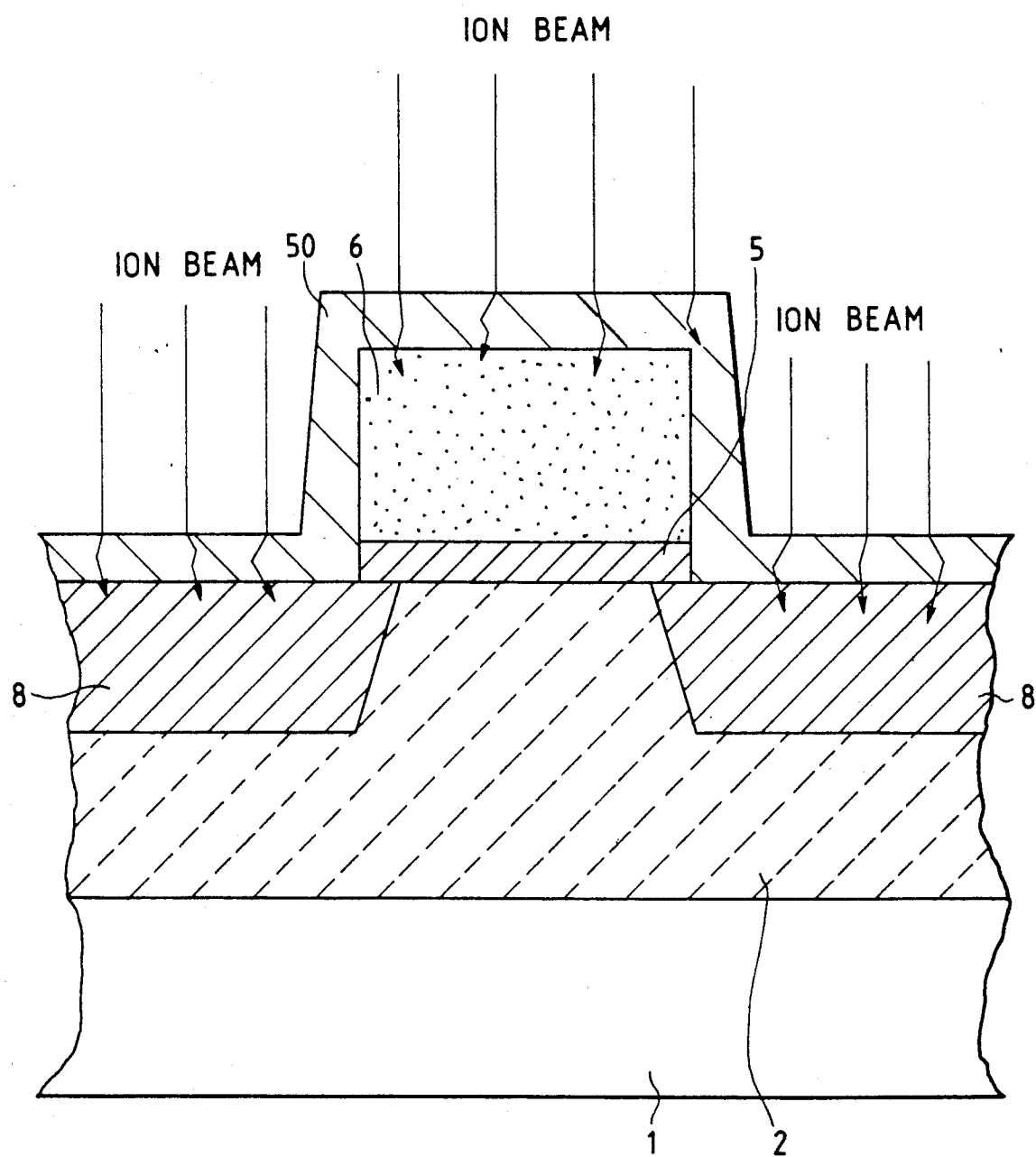

METHOD OF FABRICATING A CMOS SEMICONDUCTOR DEVICE

BACKGROUND OF THE INVENTION

This invention relates to a method of fabricating a semiconductor device such as a complementary metal-oxide semiconductor large-scale integrated circuit (CMOSLSI) or an integrated circuit including field-effect transistors.

CMOSLSIs are widely used since they consume small rates of electric power. Recently, the hot carrier effect has caused a serious problem in developing large-scale integrated circuits (LSIs).

The hot carrier effect results for the following reason. While the sizes of metal-oxide semiconductor (MOS) devices have been decreased, the power supply voltage applied to them has been fixed at 5 volts. Specifically, in a small-size MOS device, the applied power supply voltage induces a high electric field which releases some electrons from bound states. When the electrons are released, hot carriers having high energies are generated. Such hot carriers tend to be trapped within a gate oxide film of the MOS device. The trapped carriers deteriorate the characteristics of the MOS device.

The lightly doped drain (LDD) structure is a known countermeasure against the hot carrier effect. As will be explained later, a prior art method of fabricating a semiconductor device using an LDD structure has another problem lowering the characteristics of the semiconductor device.

SUMMARY OF THE INVENTION

It is an object of this invention to provide an excellent method of fabricating a semiconductor device.

According to a first aspect of this invention, a method of fabricating a semiconductor device comprises the steps of forming a gate oxide film on a semiconductor substrate; forming a gate electrode on the gate oxide film; forming means to prevent the gate electrode from being exposed to ion implantation during a subsequent ion implanting step; and implanting ions into the substrate to form a layer containing impurities in the substrate; wherein said means prevents the gate electrode from being exposed to ion implantation during the ion implanting step so that channeling is prevented from occurring in the gate electrode.

According to a second aspect of this invention, a method of fabricating a semiconductor device comprises the steps of forming a gate oxide film on a semiconductor substrate; forming a gate electrode on the gate oxide film; implanting first ions into the substrate to form an LDD layer in the substrate; forming a resist pattern covering the gate electrode; and implanting second ions into the substrate to form source and drain regions containing the LDD layer; wherein said resist pattern prevents the gate electrode from being exposed to ion implantation during the second ion implanting step so that channeling is prevented from occurring in the gate electrode.

According to a third aspect of this invention, a method of fabricating a semiconductor device comprises the steps of forming a resist pattern on a gate electrode of an NMOS transistor and on an active region of a PMOS transistor, the gate electrode and the active region extending on a common substrate; and implanting ions into the substrate to form an LDD layer in the substrate; wherein said resist pattern prevents the gate electrode from being exposed to ion implantation during the ion implanting step so that channeling is prevented from occurring in the gate electrode.

According to a fourth aspect of this invention, a method of fabricating a semiconductor device comprises the steps of forming a resist pattern on a gate electrode of a PMOS transistor and on an active region of an NMOS transistor, the gate electrode and the active region extending on a common substrate; and implanting ions into the substrate to form an LDD layer in the substrate; wherein said resist pattern prevents the gate electrode from being exposed to ion implantation during the ion implanting step so that channeling is prevented from occurring in the gate electrode.

According to a fifth aspect of this invention, a method of fabricating a semiconductor device comprises the steps of forming a resist pattern on a gate electrode of an NMOS transistor and on an active region of a PMOS transistor, the gate electrode and the active region extending on a common substrate; and implanting ions into the substrate to form source and drain regions in the substrate; wherein said resist pattern prevents the gate electrode from being exposed to ion implantation during the ion implanting step so that channeling is prevented from occurring in the gate electrode.

According to a sixth aspect of this invention, a method of fabricating a semiconductor device comprises the steps of forming a resist pattern on a gate electrode of a PMOS transistor and on an active region of an NMOS transistor, the gate electrode and the active region extending on a common substrate; and implanting ions into the substrate to form source and drain regions in the substrate; wherein said resist pattern prevents the gate electrode from being exposed to ion implantation during the ion implanting step so that channeling is prevented from occurring in the gate electrode.

According to a seventh aspect of this invention, a method of fabricating a semiconductor device comprises the steps of forming a gate oxide film on a semiconductor substrate; forming a gate electrode on the gate oxide film; forming a first protective film on the gate electrode; implanting first ions into the substrate to form an LDD layer in the substrate; removing the first protective film; forming walls around the gate electrode after said removing step; forming a second protective film on the gate electrode after said wall-forming step; and implanting second ions into the substrate to form source and drain regions in the substrate; wherein said first protective film prevents the gate electrode from being exposed to ion implantation during the first ion implanting step and said second protective film prevents the gate electrode from being exposed to ion implantation during the second ion implanting step so that channeling is prevented from occurring in the gate electrode.

According to an eighth aspect of this invention, a method of fabricating a semiconductor device comprises the steps of forming a gate oxide film on a semiconductor substrate; forming a gate electrode on the gate oxide film; forming a first protective film on the gate electrode; implanting first ions into the substrate to form an LDD layer in the substrate, wherein said first protective film prevents the gate electrode from being exposed to ion implantation during said first ion implantating step so that channeling is prevented from occurring in the gate electrode; removing the first protective film; forming walls around the gate electrode after said removing step; implanting second ions into the substrate to form source and drain regions of a PMOS transistor in the substrate; forming a second protective film on the gate electrode after said second ion implanting step; and implanting third ions into the substrate to form source and drain regions of an NMOS transistor in the substrate, wherein said second protective film prevents the gate electrode from being exposed to ion implantation during the third ion implanting step so that channeling is prevented from occurring in the gate electrode.

BRIEF DESCRIPTION OF THE DRAWINGS

FIGS. 6(a) to 6(f) are diagrams of a process flow of a CMOS device which include sectional views of a device substrate in a method according to a first embodiment of this invention.

FIG. 14 is a sectional view of a device substrate in a method according to a fourth embodiment of this invention.

Like and corresponding elements and parts are denoted by the same reference characters throughout the drawings.

DESCRIPTION OF THE FIRST PREFERRED EMBODIMENT

Before the description of embodiments of this invention, a prior art method of fabricating a semiconductor device will be described hereinafter for a better understanding of this invention.

Figure 1A:
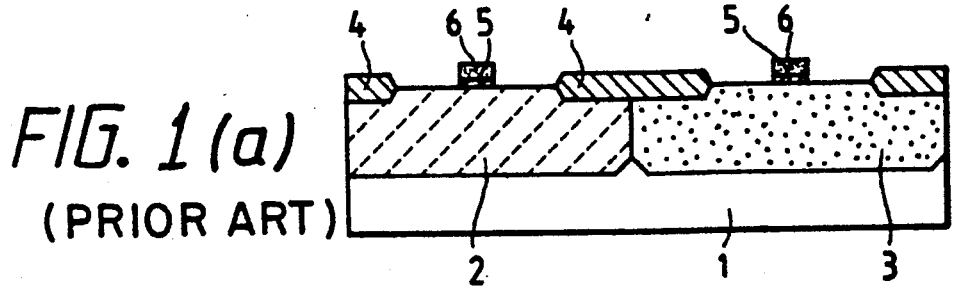
FIGS. 1(a) to 1(e) are diagrams of a process flow of a CMOS device which include sectional views of a device substrate in a prior art method.
Figure 1B:
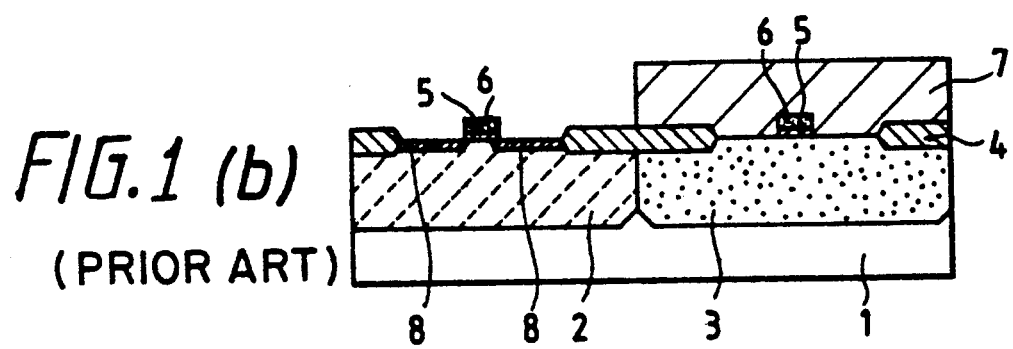
Figure 1C:
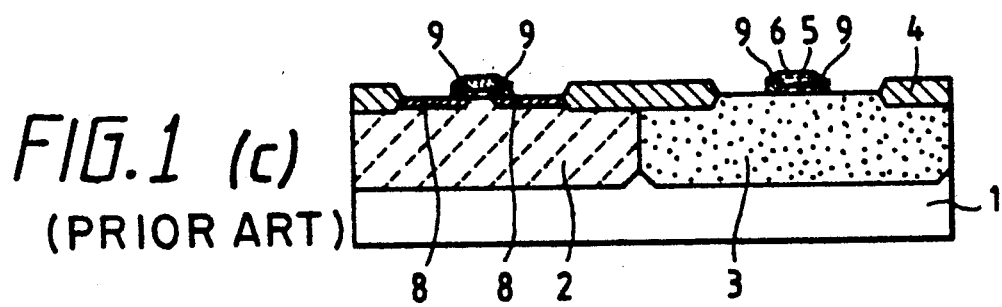
Figure 1D:
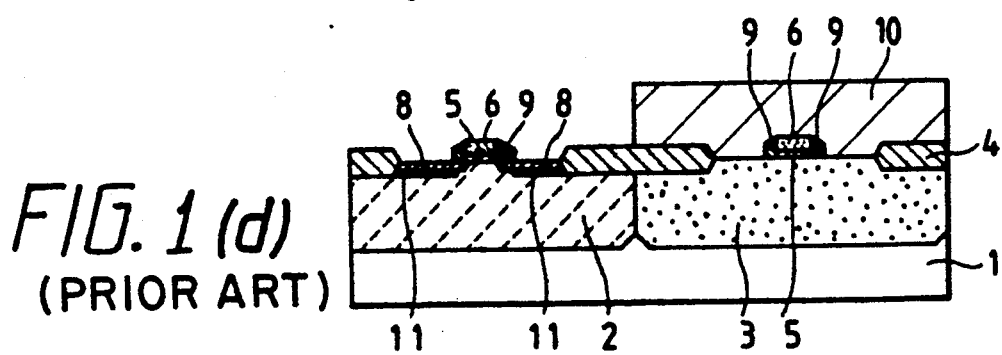
Figure 1E:
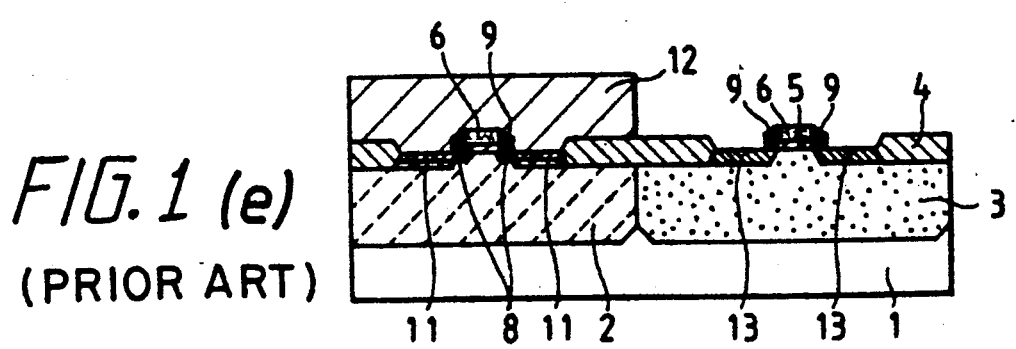

In a prior art method, as shown in FIG. 1(a), a p-type well (P well) 2 and an n-type well (N well) 3 are formed on a silicon substrate 1. An n-type MOS (NMOS) device and a p-type MOS (PMOS) device will be provided on the P well 2 and the N well 3 respectively. Thick field oxide films 4 are formed on the P well 2 and the N well 3 and then thin gate oxide films 5 are formed thereon, and gate electrodes 6 having a low resistance are provided on the gate oxide films 5. The gate electrodes 6 are made of impurity-doped polycrystalline silicon. Next, as shown in FIG. 1(b), the N well side of the substrate is coated with a resist pattern 7. The formation of the resist pattern 7 is performed by photolithography using an ND (n-type diffusion) mask 32 of FIG. 2. The ND mask 32 has a crystal substrate 30 and an ND pattern 31 extending on the substrate 30. The ND pattern 31 is made of chromium. Phosphorous ions are implanted into the P well 2 so that n⁻layers 8 are formed on the P well 2. During the phosphorous ion implantation, the acceleration energy (the implant energy) is 40 KeV. The implanted quantity of phosphorous ions is in the range of $1E13/cm^2$ to $3E13/cm^2$. At the surfaces of the n⁻layers 8, the concentration of phosphorous ions is about $1E18/cm^3$. During the phosphorous ion implantation into the P well 2, the gate electrodes 6 on the P well 2 are exposed to the phosphorous ion implantation. After the phosphorous ion implantation, the resist pattern 7 is removed. Then, as shown in FIG. 1(c), walls 9 are formed which extend along sides of the gate oxide films 5 and the gate electrodes 6. The side walls 9 function to determine the positions of high impurity-density layers for sources and drains of transistors. The side walls 9 are formed by coating the entire substrate surfaces with an insulating layer and then removing an unnecessary portion of the insulating layer. Specifically, the unnecessary insulating layer is removed by performing unisotropic etching back along a vertical direction with respect to the silicon substrate 1 and to a degree corresponding to the thickness of the insulating layer. After the side walls 9 are formed, the N well side of the substrate is coated with a resist pattern 10 as shown in FIG. 1(d). The formation of the resist pattern 10 is performed by photolithography using the ND mask 32 of FIG. 2. Arsenic ions are implanted into the P well 2 through the n⁻layers 8 so that source and drain layers 11 are formed on the P well 2. During the arsenic ion implantation, the acceleration energy (the implant energy) is 40–80 KeV. The implanted quantity of arsenic ions is in the range of $4E15/cm^2$ to $6E15/cm^2$. During the arsenic ion implantation into the P well 2, the gate electrodes 6 on the P well 2 are exposed to the arsenic ion implantation. The exposure of the gate electrodes 6 on the P well 2 to the arsenic ion implantation causes channeling in the gate electrodes 6 as will be described later. The phosphorous ion implantation and the arsenic ion implantation cooperate to form source and drain layers 11 of a lightly doped structure in which the density of impurities varies at a small rate in the vertical direction with respect to the silicon substrate 1. In respect of drains, an LDD structure is thus constructed. The small rate of the variation in the impurity density prevents the occurrence of a locally-induced high electric field which might cause hot carriers. After the arsenic ion implantation, the resist pattern 10 is removed. During a subsequent period, as shown in FIG. 1(e), the P well side of the substrate is coated with a resist pattern 12. The formation of the resist pattern 12 is performed by photolithography using a PD (p-type diffusion) mask 34 of FIG. 3. The PD mask 34 has a crystal substrate 30 and a PD pattern 33 extending on the substrate 30. $BF_2$ ions are implanted into the N well 3 so that source and drain layers 13 are formed on the N well 3. During the $BF_2$ ion implantation, the acceleration energy (the implant energy) is 20–60 KeV. The implanted quantity of $BF_2$ ions is in the range of $1E15/cm^2$ to $5E15/cm^2$.

Figure 2:
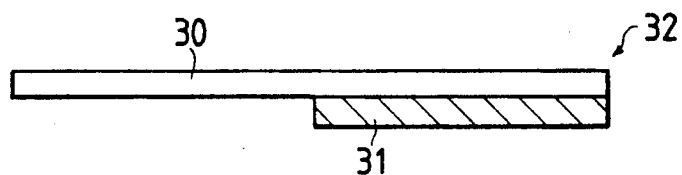
FIG. 2 is a sectional view of a mask used in the prior art method of FIG. 1.
Figure 3:
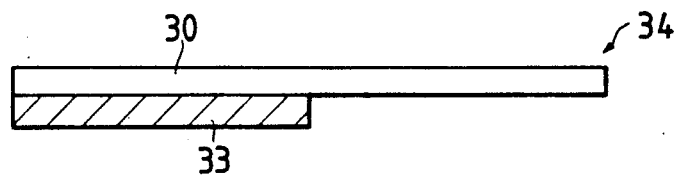
FIG. 3 is a sectional view of another mask used in the prior art method of FIG. 1.

The prior art method of FIGS. 1–3 has the following problem. During the phosphorous ion implantation or the arsenic ion implantation, a beam of phosphorous or arsenic ions is also applied to the gate electrodes 6 and thus channeling tends to be caused in the gate electrodes 6. Specifically, a large number of implanted phosphorous or arsenic ions advance through of the polycrystalline silicon of the gate electrodes 6 and reach the gate oxide films 5, deteriorating the characteristics of the semiconductor device. The polycrystalline silicon grown on the gate oxide films 5 has certain surface orientation properties, which enable the implanted ions to advance for a long range along a certain direction.

Figure 4:
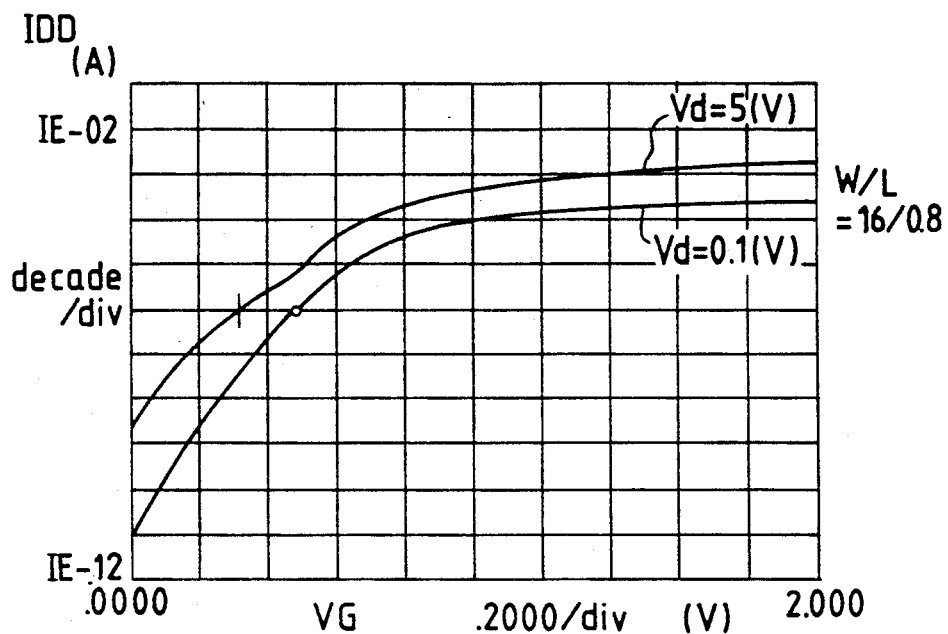
FIG. 4 is a diagram showing hump-shaped IDD-VG characteristic curves of NMOS transistors fabricated by the prior art method of FIG. 1.
Figure 5:
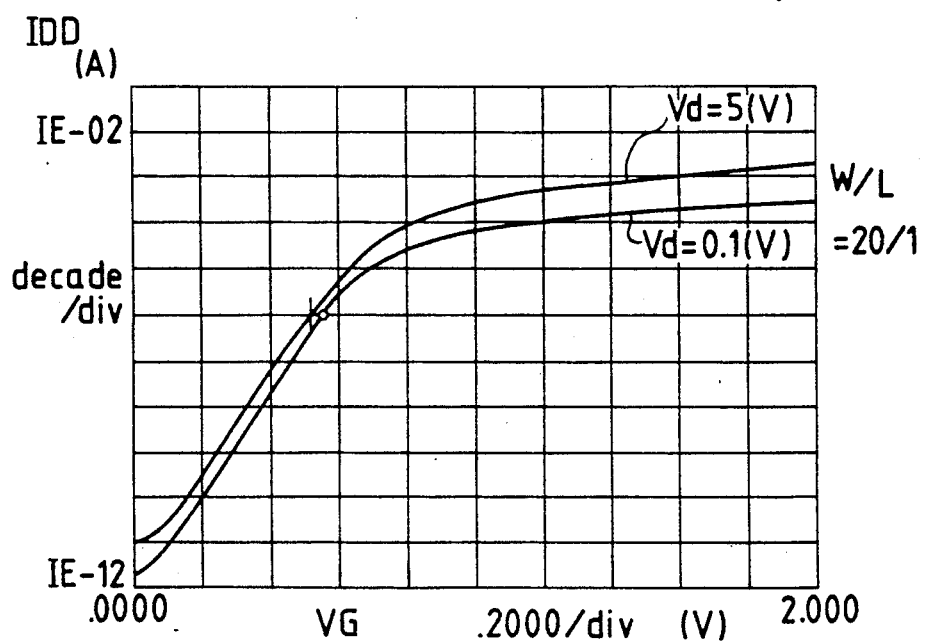
FIG. 5 is a diagram showing normal IDD-VG characteristic curves of NMOS transistors fabricated by the prior art method of FIG. 1.

During experiments, NMOS transistors were fabricated by the prior method of FIGS. 1–3. In the NMOS transistors, the length of gate electrodes was 0.8 μm and the thickness of the gate oxide films was 16 nm. During the fabrication of the NMOS transistors, the phosphorous ion implantation was performed under conditions where the acceleration energy was 40 KeV and the implanted quantity of phosphorous ions was $2E13/cm^2$. During the fabrication of the NMOS transistors, the arsenic ion implantation was performed under conditions where the acceleration energy was 80 KeV and the implanted quantity of arsenic ions was $6E15/cm^2$. Twenty percent of the fabricated NMOS transistors had a hump-shaped IDD-VG characteristic curve such as shown in FIG. 4. The letters IDD and VG denote a drain current and a gate voltage respectively. The other NMOS transistors had a normal IDD-VG characteristic curve such as shown in FIG. 5. It was experimentally found that the deterioration in the characteristics of the semiconductor devices was more conspicuous as the gate oxide films were thinner and the gate electrodes were shorter.

In order to resolve the previously-mentioned problem in the prior art method, a method of this invention is intended to prevent channeling in gate electrodes and a hump-shaped IDD-VG characteristic curve. A first embodiment of this invention will be described hereinafter.

Figure 6D:
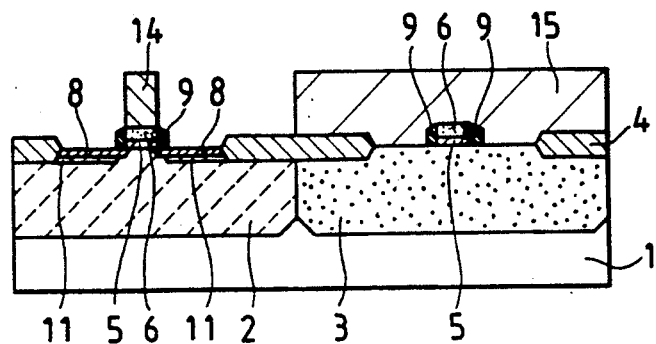
Figure 6E:
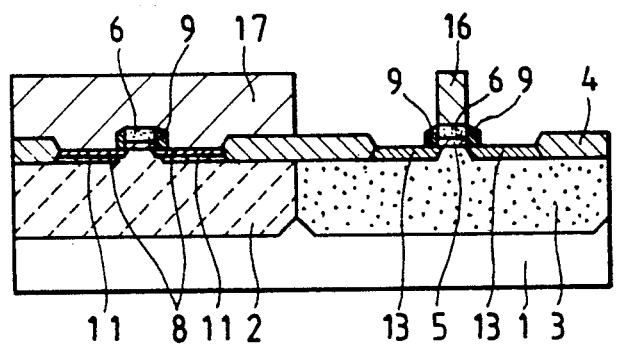
Figure 6F:
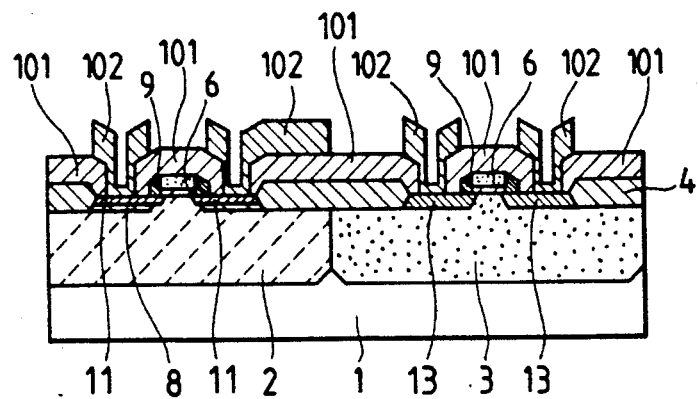

In a method according to a first embodiment of this invention, as shown in FIG. 6(a), a p-type well (P well) 2 and an n-type well (N well) 3 are formed on a silicon substrate 1. An n-type MOS (NMOS) device and a p-type MOS (PMOS) device will be provided on the P well 2 and the N well 3 respectively. A thick field oxide film 4 is formed on the boundary between the P well 2 and the N well 3 to separate MOS devices which will be provided on the P well 2 and the N well 3. Thick field oxide films 4 are also formed on edges of the P well 2 and the N well 3. The field oxide films 4 have a thickness of about 500 nm. After thin gate oxide films 5 are formed on the P well 2 and the N well 3, polycrystalline silicon having a high concentration of impurities is deposited on the gate oxide films 5 to form gate electrodes 6 thereon. The gate oxide films 5 have a thickness of about 10–25 nm. The gate electrodes 6 have a thickness of about 300 nm and a low resistance. The formation of the gate electrodes 6 is performed by photolithography using a PS (polycrystalline silicon) mask with a PS pattern 35 which will be described later. Next, as shown in FIG. 6(b), the N well side of the substrate is coated with a resist pattern 7. The formation of the resist pattern 7 is performed by photolithography using an ND (n-type diffusion) mask with an ND pattern 31 which will be described later. Phosphorous ions are implanted into the P well 2 so that $n^-$ layers 8 corresponding to LDD layers are formed on the P well 2. During the phosphorous ion implantation, the acceleration energy (the implant energy) is 40 KeV. The implanted quantity of phosphorous ions is in the range of $1E13/cm^2$ to $3E13/cm^2$. At the surfaces of the $n^-$ layers 8, the concentration of phosphorous ions is about $1E18/cm^3$. After the phosphorous ion implantation, the resist pattern 7 is removed. Then, as shown in FIG. 6(c), walls 9 are formed which extend along sides of the gate oxide films 5 and the gate electrodes 6. The side walls 9 function to determine the positions of high impurity-density layers for sources and drains of transistors. The side walls 9 are formed by coating the entire substrate surfaces with an insulating layer having a thickness of about 150–250 nm through a CVD process, and then removing an unnecessary portion of the insulating layer. Specifically, the unnecessary insulating layer is removed by performing unisotropic etching back along a vertical direction with respect to the silicon substrate 1 and to a degree corresponding to the thickness of the insulating layer. The side walls 9 are made of $SiO_2$ and have a width of 0.1–0.25 μm. After the side walls 9 are formed, the N well side of the substrate is coated with a resist pattern 15 and also the gate electrodes 6 on the P well 2 are coated with a resist pattern 14 as shown in FIG. 6(d). The formation of the resist patterns 14 and 15 is performed by photolithography using a mask 36 of FIG. 7. The mask 36 has a crystal substrate 30, and a PS pattern 35 and an ND pattern 31 extending on the substrate 30. The PS pattern 35 and the ND pattern 31 correspond to the resist pattern 14 and the resist pattern 15 respectively. Two separate masks having the PS pattern 35 and the ND pattern 31 respectively may be used in place of the single mask 36. During the formation of the resist pattern 14, the side walls 9 prevent a misalignment between the PS pattern 35 and the gate electrodes 6 on the P well 2 from causing a problem. Arsenic ions are implanted into the P well 2 through the $n^-$ layers 8 so that source and drain layers 11 are formed on the P well 2. During the arsenic ion implantation, the acceleration energy (the implant energy) is 40–80 KeV. The implanted quantity of arsenic ions is in the range of $4E15/cm^2$ to $6E15/cm^2$. During the arsenic ion implantation into the P well 2, the resist pattern 14 prevents the gate electrodes 6 on the P well 2 from being exposed to the arsenic ion implantation. Therefore, channeling is prevented from occurring in the gate electrodes 6 on the P well 2. During the formation of the source and drain layers 11, edges of the side walls 9 determine edges of the source and drain layers 11. After the arsenic ion implantation, the resist patterns 14 and 15 are removed. During a subsequent period, as shown in FIG. 6(e), the P well side of the substrate is coated with a resist pattern 17 and also the gate electrodes 6 on the N well 3 are coated with a resist pattern 16. The formation of the resist patterns 16 and 17 is performed by photolithography using a mask 37 of FIG. 8. The mask 37 has a crystal substrate 30, and a PS pattern 35 and a PD pattern 33 extending on the substrate 30. The PS pattern 35 and the PD pattern 33 correspond to the resist pattern 16 and the resist pattern 17 respectively. Two separate masks having the PS pattern 35 and the PD pattern 33 respectively may be used in place of the single mask 37. During the formation of the resist pattern 16, the side walls 9 prevent a misalignment between the PS pattern 35 and the gate electrodes 6 on the N well 3 from causing a problem. BF$_2$ ions are implanted into the N well 3 so that source and drain layers 13 are formed on the N well 3. During the BF$_2$ ion implantation, the acceleration energy (the implant energy) is 20–60 KeV. The implanted quantity of BF$_2$ ions is in the range of 1E15/cm$^2$ to 5E15/cm$^2$. During the BF$_2$ ion implantation into the N well 3, the resist pattern 16 prevents the gate electrodes 6 on the N well 3 from being exposed to the BF$_2$ ion implantation. Therefore, channeling is prevented from occurring in the gate electrodes 6 on the N well 3. During the formation of the source and drain layers 13, edges of the side walls 9 determine edges of the source and drain layers 13. After the BF$_2$ ion implantation, the resist patterns 16 and 17 are removed. Next, as shown in FIG. 6(f), a PSG layer 101 is deposited on the substrate surface to form interlayer insulating films. Openings for electrical connections to source regions, drain regions, and the gate electrodes 6 are formed by etching the PSG film 101. Then, wiring material 102 of Al-Si-Cu is deposited on suitable locations by a vapor deposition process to complete the sources, the drains, and the gates of transistors.

Figure 7:
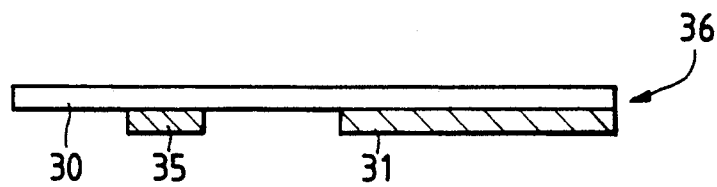
FIG. 7 is a sectional view of a mask used in the embodiment of FIG. 6.
Figure 8:
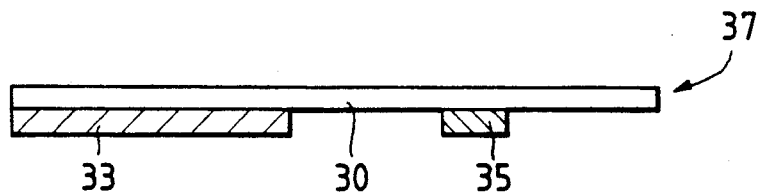
FIG. 8 is a sectional view of another mask used in the embodiment of FIG. 6.
Figure 9:
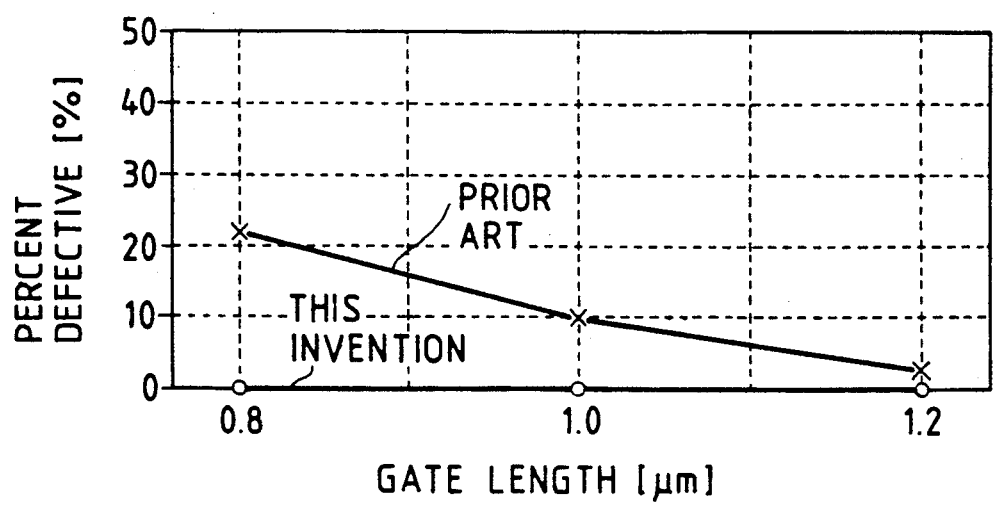
FIG. 9 is a diagram showing the relation between the percent defective and the gate length in NMOS transistors fabricated by the prior art method of FIG. 1 and the method of the embodiment of FIG. 6.

Experiments were performed on the percentage of defective NMOS transistors fabricated by the prior art method of FIGS. 1–3 and the method of the embodiment of FIGS. 6–8. During the experiments, NMOS transistors exhibiting hump-shaped IDD-VG characteristic curves were regarded as being defective. FIG. 9 shows the results of the experiments. As shown in FIG. 9, in respect of NMOS transistors fabricated by the prior art method of FIGS. 1–3, the defective percentage increased as the gate length decreased. For example, the percent defective was 20% at a gate length of 0.8 μm. In respect of NMOS transistors fabricated by the method of the embodiment of FIGS. 6–8, the defective percentage remained null as the gate length varied between 0.8 μm and 1.2 μm.

This embodiment may be modified as follows. In a first modification, the PMOS device also has an LDD structure. In a second modification, during the phosphorous ion implantation, a resist pattern prevents the gate electrodes 6 on the P well 2 from being exposed to a beam of phosphorous ions. In a third modification, the PMOS device is formed after the NMOS device is formed. A fourth modification uses silicide gates or metal gates as the gate electrodes 6. In a fifth modification, a substrate is made of p-type silicon and has an N well. In a sixth modification, a substrate is made of n-type silicon and has a P well. In a seventh embodiment, a substrate is made of a compound semiconductor such as GaAs. This embodiment may be applied to FET structures other than the CMOS structure.

DESCRIPTION OF THE SECOND PREFERRED EMBODIMENT

Figure 10:
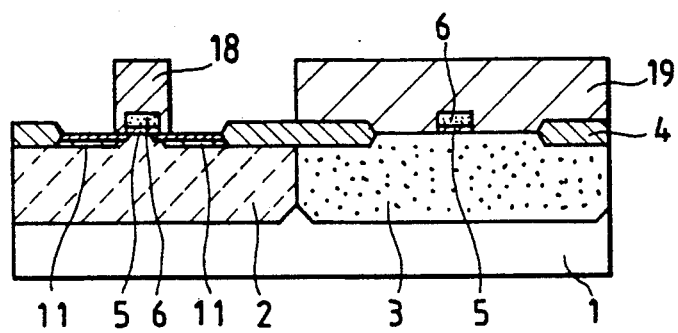
FIG. 10 is a sectional view of a device substrate in a method according to a second embodiment of this invention.
Figure 11:
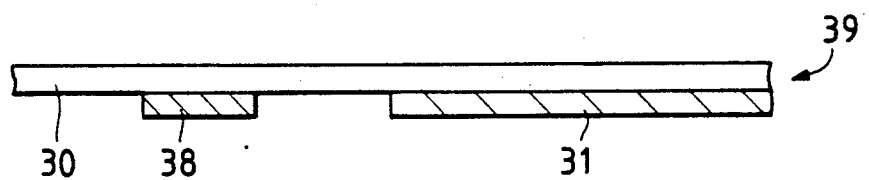
FIG. 11 is a sectional view of a mask used in the embodiment of FIG. 10.
Figure 12:
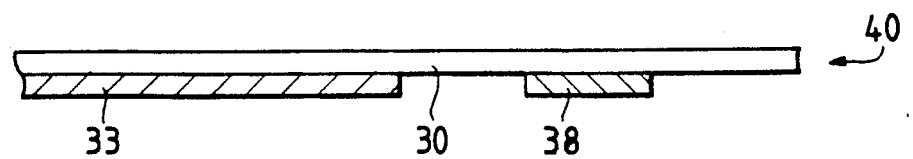
FIG. 12 is a sectional view of another mask used in the embodiment of FIG. 10.

FIGS. 10–12 relate to a second embodiment of this invention which is similar to the embodiment of FIGS. 6–8 except for design changes indicated later.

In the embodiment of FIGS. 10–12, side walls 9 (see FIG. 6) are omitted. After the phosphorous ion implantation is completed and then the resist pattern 7 (see FIG. 6) is removed, the N well side of the substrate is coated with a resist pattern 19 and also the gate electrodes 6 on the P well 2 are coated with a resist pattern 18 as shown in FIG. 10. The resist pattern 18 completely covers the side surfaces and the upper surfaces of the gate electrodes 6 on the P well 2. The portions of the resist pattern 18 which surround the side surfaces of the gate electrodes 6 on the P well 2 serve as the side walls 9 (see FIG. 6). The formation of the resist patterns 18 and 19 is performed by photolithography using a mask 39 of FIG. 11. The mask 39 has a crystal substrate 30, and a PS pattern 38 and an ND pattern 31 extending on the substrate 30. The PS pattern 38 and the ND pattern 31 correspond to the resist pattern 18 and the resist pattern 19 respectively. The PS pattern 38 is extended by 0.3–0.5 μm relative to the PS pattern 35 of FIG. 7.

In the case where the PMOS device has an LDD structure, resist patterns are formed on the P well 2 and the gate electrodes 6 on the N well 3 by photolithography using a mask 40 of FIG. 12. The mask 40 has a crystal substrate 30, and a PS pattern 38 and a PD pattern 33 extending on the substrate 30. The PS pattern 38 is extended relative to the PS pattern 35 of FIG. 8.

DESCRIPTION OF THE THIRD PREFERRED EMBODIMENT

Figure 13A:
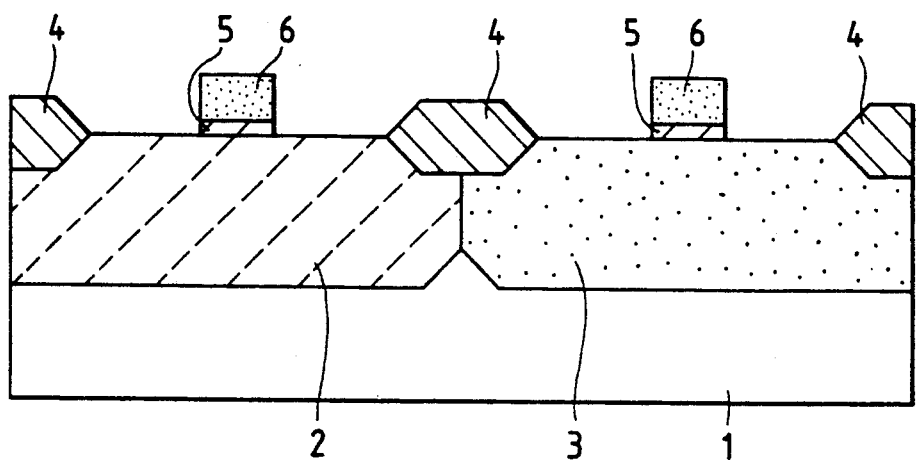
FIGS. 13(a) to 13(h) are diagrams of a process flow of a CMOS device which include sectional views of a device substrate in a method according to a third embodiment of this invention.
Figure 13B:
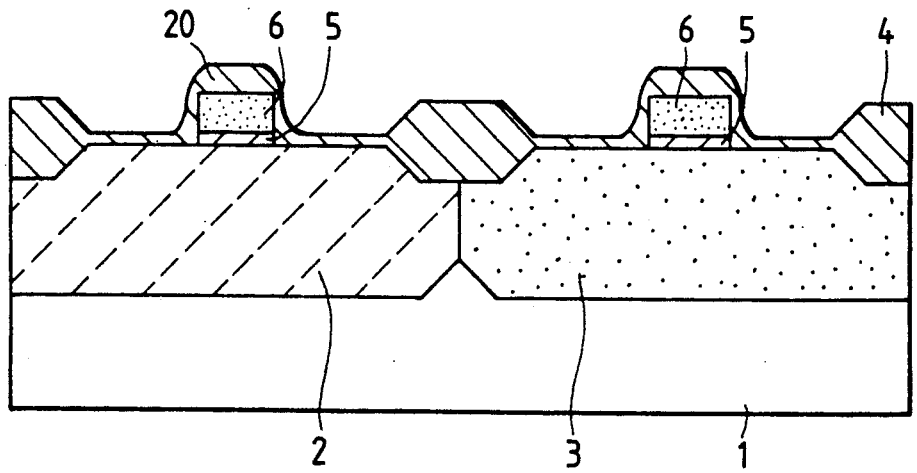

As shown in FIG. 13(a), a p-type well (P well) 2 and an n-type well (N well) 3 are formed on a silicon substrate 1. An n-type MOS (NMOS) device and a p-type MOS (PMOS) device will be provided on the P well 2 and the N well 3 respectively. A thick field oxide film 4 is formed on the boundary between the P well 2 and the N well 3 to separate MOS devices which will be provided on the P well 2 and the N well 3. Thick field oxide films 4 are also formed on edges of the P well 2 and the N well 3. The field oxide films 4 have a thickness of about 500 nm. After thin gate oxide films 5 are formed on the P well 2 and the N well 3, polycrystalline silicon having a high concentration of impurities is deposited on the gate oxide films 5 and the deposited polycrystalline silicon is etched to form gate electrodes 6 on the gate oxide films 5. The gate oxide films 5 have a thickness of about 10–25 nm. The gate electrodes 6 have a thickness of about 300 nm and a low resistance. Next, as shown in FIG. 13(b), the entire substrate surface is oxidized to form a thermally oxidized film or an amorphous film 20 covering the substrate. As will be described later, the thermally oxidized film 20 prevents the gate electrodes 6 from being exposed to a beam of ions during ion implantation. The thickness of the thermally oxidized film 20 extending over source and drain regions is chosen to be 10–20 nm. In this case, the thickness of the thermally oxidized film 20 extending above the gate electrodes 6 is about 50 nm since the impurity density at the surface portion of the gate electrodes 6 is greater than the impurity density at the surface portions of the source and drain regions and thus the rate of the oxidization on the gate electrodes 6 is higher than the rate of the oxidization on the source and drain regions. Subsequently, as shown in FIG. 6(c), the N well side of the substrate is coated with a resist pattern 21. Phosphorous ions are implanted into the P well 2 through the thermally oxidized film 20 so that n− layers 8 corresponding to LDD layers are formed on the P well 2. During the phosphorous ion implantation, the acceleration energy (the implant energy) is 40 KeV. The implanted quantity of phosphorous ions is in the range of 1E13/cm² to 3E13/cm². At the surfaces of the n− layers 8, the concentration of phosphorous ions is about 1E18/cm³. During the phosphorous ion implantation, the gate electrodes 6 on the P well 2 are protected from a beam of phosphorous ions by the thermally oxidized film 20. Specifically, under these conditions of the phosphorous ion implantation, the path length of phosphorous ions is about 40 nm in the thermally oxidized film 20. Since the thickness of the thermally oxidized film 20 extending over the source and drain regions is about 10–20 nm, phosphorous ions can pass through the thermally oxidized film 20 and can form desired n− layers 8 in the source and drain regions. Since the thickness of the thermally oxidized film 20 on the gate electrodes 6 is about 50 nm, phosphorous ions are prevented from passing through the thermally oxidized film 20 and then reaching the gate electrodes 6. Accordingly, channeling is prevented from occurring in the gate electrodes 6 on the P well 2. After the phosphorous ion implantation, the resist pattern 21 is removed. As shown in FIG. 13(d), the thermally oxidized film 20 is also removed. Then, walls 9 are formed which extend along sides of the gate oxide films 5 and the gate electrodes 6. The side walls 9 function to determine the positions of high impurity-density layers for sources and drains of transistors. The side walls 9 are formed by coating the entire substrate surfaces with an insulating layer having a thickness of about 150–250 nm through a CVD process, and then removing an unnecessary portion of the insulating layer. Specifically, the unnecessary insulating layer is removed by performing unisotropic etching back along a vertical direction with respect to the silicon substrate 1 and to a degree corresponding to the thickness of the insulating layer. The side walls are made of SiO₂ and have a width of 0.1–0.25 μm. Then, as shown in FIG. 13(e), the entire substrate surface is oxidized to form a thermally oxidized film or an amorphous film 22 covering the substrate. As will be described later, the thermally oxidized film 22 prevents the gate electrodes 6 from being exposed to a beam of ions during ion implantation. The thickness of the thermally oxidized film 22 extending over the source and drain regions is chosen to be 10–20 nm. In this case, the thickness of the thermally oxidized film 22 extending above the gate electrodes 6 is about 50 nm since the rate of the oxidization on the gate electrodes 6 is higher than the rate of the oxidization on the source and drain regions. During a subsequent period, as shown in FIG. 13(f), the P well side of the substrate is coated with a resist pattern 23. BF₂ ions are implanted into the N well 3 through the thermally oxidized film 22 so that source and drain layers 13 are formed on the N well 3. During the BF₂ ion implantation, the acceleration energy (the implant energy) is 40 KeV. The implanted quantity of BF₂ ions is about 3E15/cm². During the BF₂ ion implantation into the N well 3, the thermally oxidized film 22 prevents the gate electrodes 6 on the N well 3 from being exposed to the BF₂ ion implantation. Therefore, channeling is prevented from occurring in the gate electrodes 6 on the N well 3. Next, as shown in FIG. 13(g), the N well side of the substrate is coated with a resist pattern 24. Arsenic ions are implanted into the P well 2 through the thermally oxidized film 22 and the n− layers' 8 so that source and drain layers 11 are formed on the P well 2. During the arsenic ion implantation, the acceleration energy (the implant energy) is about 80 KeV. The implanted quantity of arsenic ions is about 6E15/cm². During the arsenic ion implantation into the P well 2, the thermally oxidized film 22 prevents the gate electrodes 6 on the P well 2 from being exposed to the arsenic ion implantation. Therefore, channeling is prevented from occurring in the gate electrodes 6 on the P well 2. In addition, impurities within the gate electrodes 6 on the P well are prevented from being knocked by implanted arsenic ions. After the arsenic ion implantation, the resist pattern 24 is removed. Next, as shown in FIG. 13(h), a PSG layer 101 is deposited on the substrate surface to form interlayer insulating films. Openings for electrical connections to source regions, drain regions, and the gate electrodes 6 are formed by etching the PSG film 101 and the thermally oxidized film 22. Then, wiring material 102 of Al-Si-Cu is deposited on suitable locations by a vapor deposition process to complete the sources, the drains, and the gates of transistors.

This embodiment may be modified as follows. In a first modification, the PMOS device also has an LDD structure. In a second modification, the PMOS device is formed after the NMOS device is formed. A third modification uses silicide gates or metal gates as the gate electrodes 6. In a fourth modification, a substrate is made of p-type silicon and has an N well. In a fifth modification, a substrate is made of n-type silicon and has a P well. In a sixth embodiment, a substrate is made of compound semiconductor such as GaAs. This embodiment may be applied to FET structures other than the CMOS structure.

DESCRIPTION OF THE FOURTH PREFERRED EMBODIMENT

Figure 13:
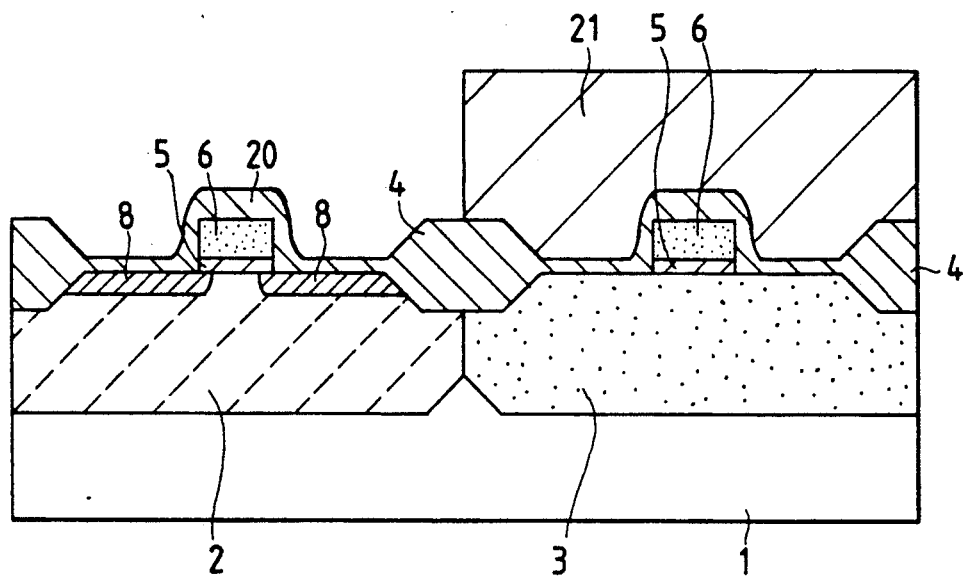
Figure 13:
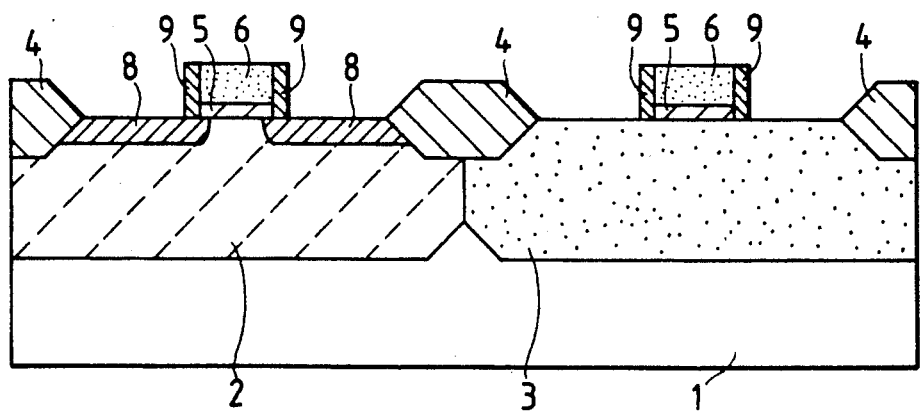
Figure 13E:
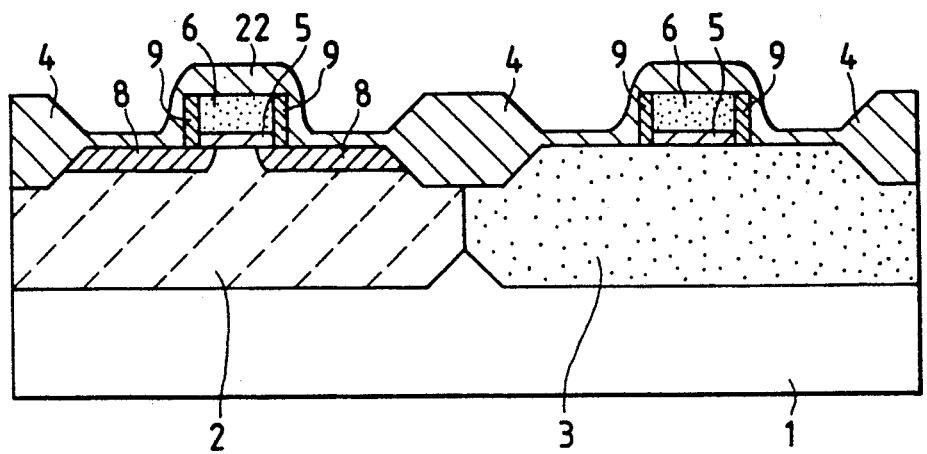
Figure 13F:
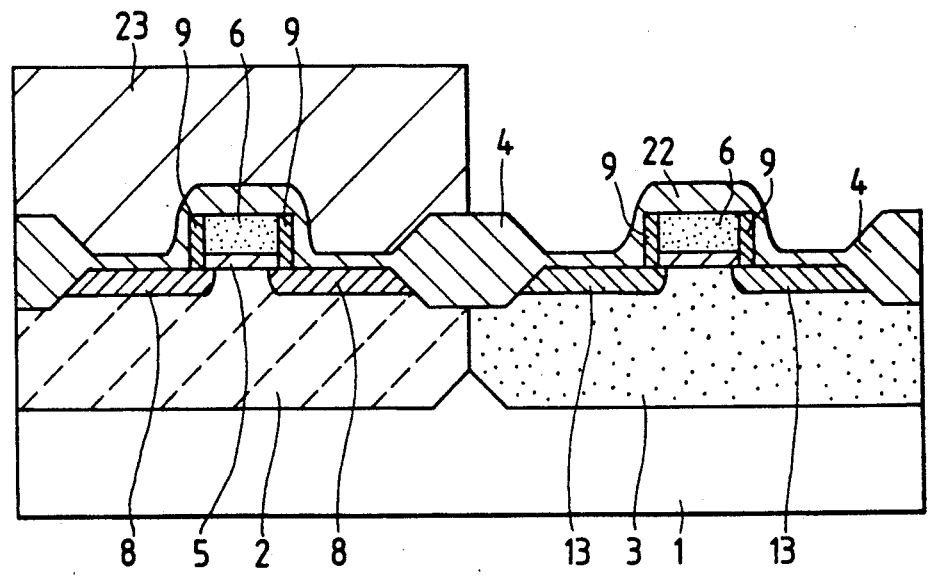
Figure 13G:
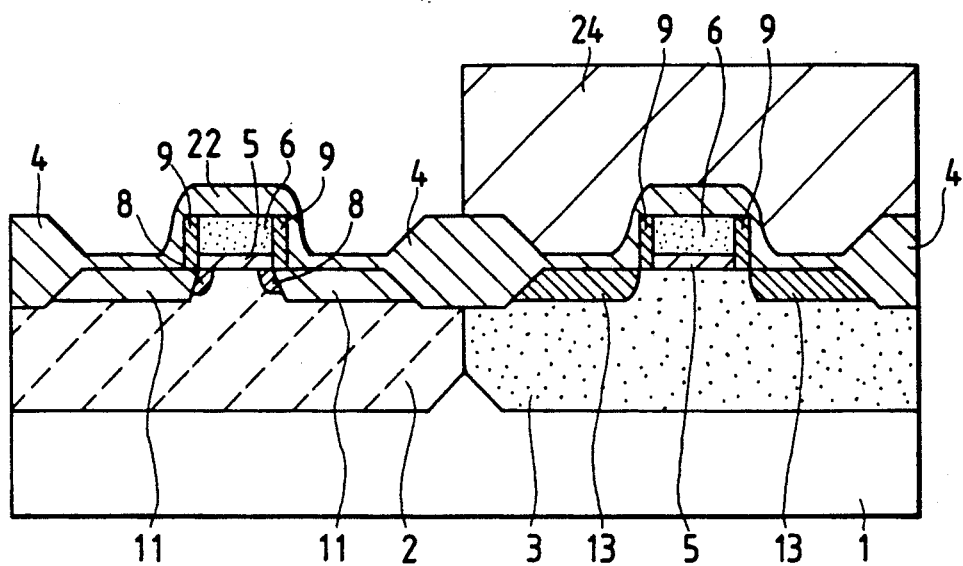
Figure 13H:
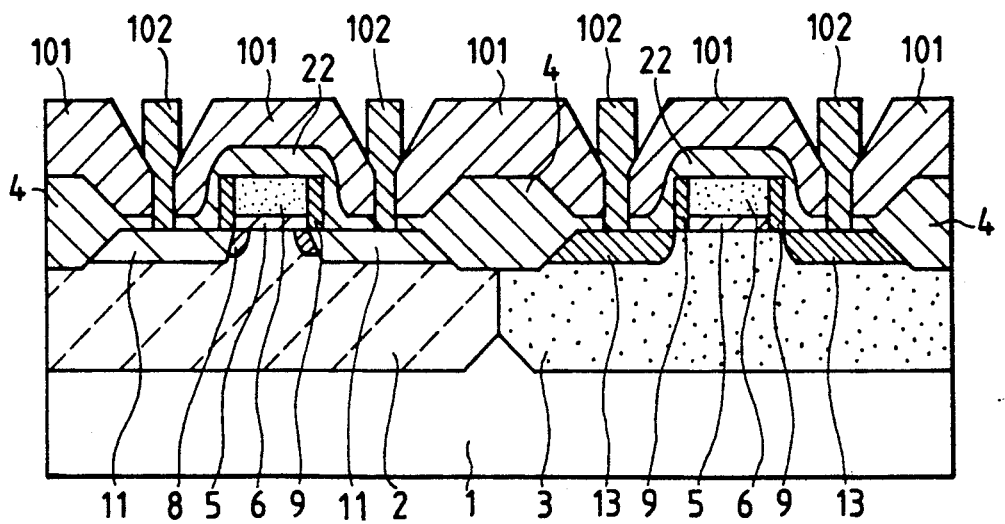

A fourth embodiment is similar to the embodiment of FIG. 13 except for the following design change. In the fourth embodiment, the thermally oxidized film 20 or 22 (see FIG. 13) is replaced with a film of amorphous material such as oxide, nitride, tungsten silicide, or titanium silicide which is deposited on the entire substrate surface by a CVD process or a sputtering process. Specifically, as shown in FIG. 14, an amorphous film 50 of approximately a uniform thickness is deposited on the entire substrate surface before ion implantation for generating an LDD structure is performed. The thickness of the amorphous film 50 is about 10–20 nm. During the ion implantation, the amorphous film 50 scatters implanted ions as shown by the arrow lines, greatly decreasing the number of implanted ions advancing in gate electrodes 6 along a given direction matching to the surface orientation properties of grains of the polycrystalline silicon of the gate electrodes 6. In addition, since the gate electrodes 6 are thick, it is generally difficult for implanted ions to pass through the gate electrodes 6. Therefore, implanted ions are essentially prevented from passing through the gate electrodes 6 so that channeling is also prevented from occurring in the gate electrodes 6.

DESCRIPTION OF THE FIFTH PREFERRED EMBODIMENT

Figure 15:
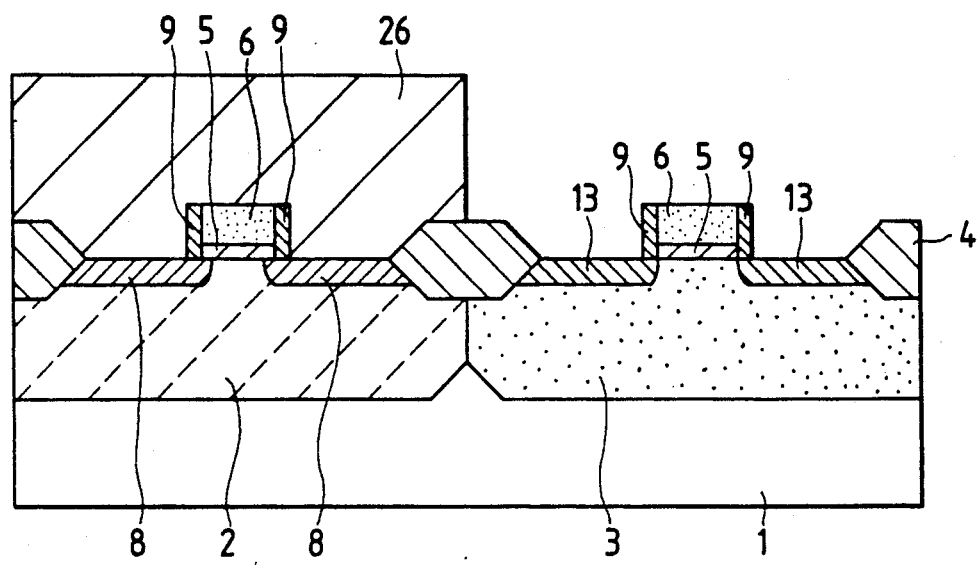
FIGS. 15(a) to 15(c) are diagrams of a process flow of a CMOS device which include sectional views of a device substrate in a method according to a fifth embodiment of this invention.
Figure 15:
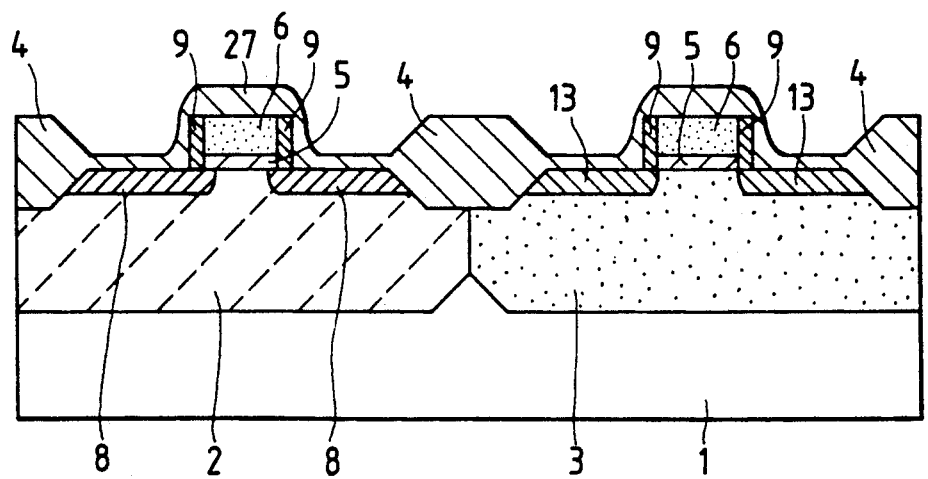

FIG. 15 shows a fifth embodiment of this invention which is similar to the embodiment of FIG. 13 except for design changes indicated hereinafter.

Figure 15C:
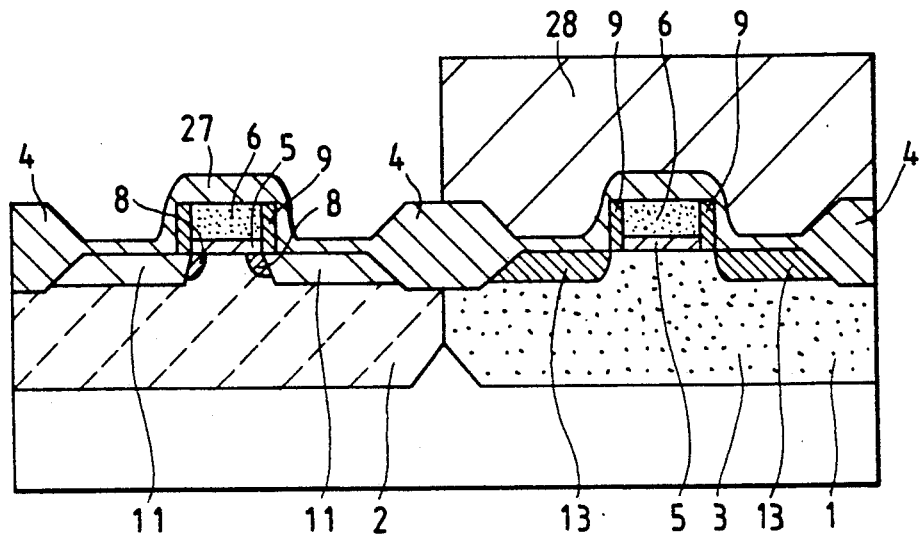

In the fifth embodiment, after side walls 9 are formed, the P well side of the substrate is coated with a resist pattern 26 without forming the thermally oxidized film 22 (see FIG. 13). $BF_2$ ions are implanted into the N well 3 so that source and drain layers 13 are formed on the N well 3. During the $BF_2$ ion implantation, the acceleration energy (the implant energy) is 40 KeV. The implanted quantity of $BF_2$ ions is about $3E15/cm^2$. After the $BF_2$ ion implantation, the resist pattern 26 is removed. Then, as shown in FIG. 15(b), the entire substrate surface is oxidized to form a thermally oxidized film 27 covering the substrate. The thickness of the thermally oxidized film 27 is chosen to be 10-20 nm at source and drain regions of the NMOS. In this case, the thickness of the thermally oxidized film 27 is about 50 nm at the gate electrodes 6. Next, as shown in FIG. 15(c), the N well side of the substrate is coated with a resist pattern 28. Arsenic ions are implanted into the P well 2 through the thermally oxidized film 27 and the $n^-$ layers 8 so that source and drain layers 11 are formed on the P well 2. During the arsenic ion implantation, the acceleration energy (the implant energy) is about 80 KeV. The implanted quantity of arsenic ions is about $6E15/cm^2$. During the arsenic ion implantation into the P well 2, the thermally oxidized film 27 prevents the gate electrodes 6 on the P well 2 from being exposed to the arsenic ion implantation. Therefore, channeling is prevented from occurring in the gate electrodes 6 on the P well 2. In addition, impurities within the gate electrodes 6 on the P well are prevented from being knocked by implanted arsenic ions. After the arsenic ion implantation, the resist pattern 28 is removed.

Figure 16:
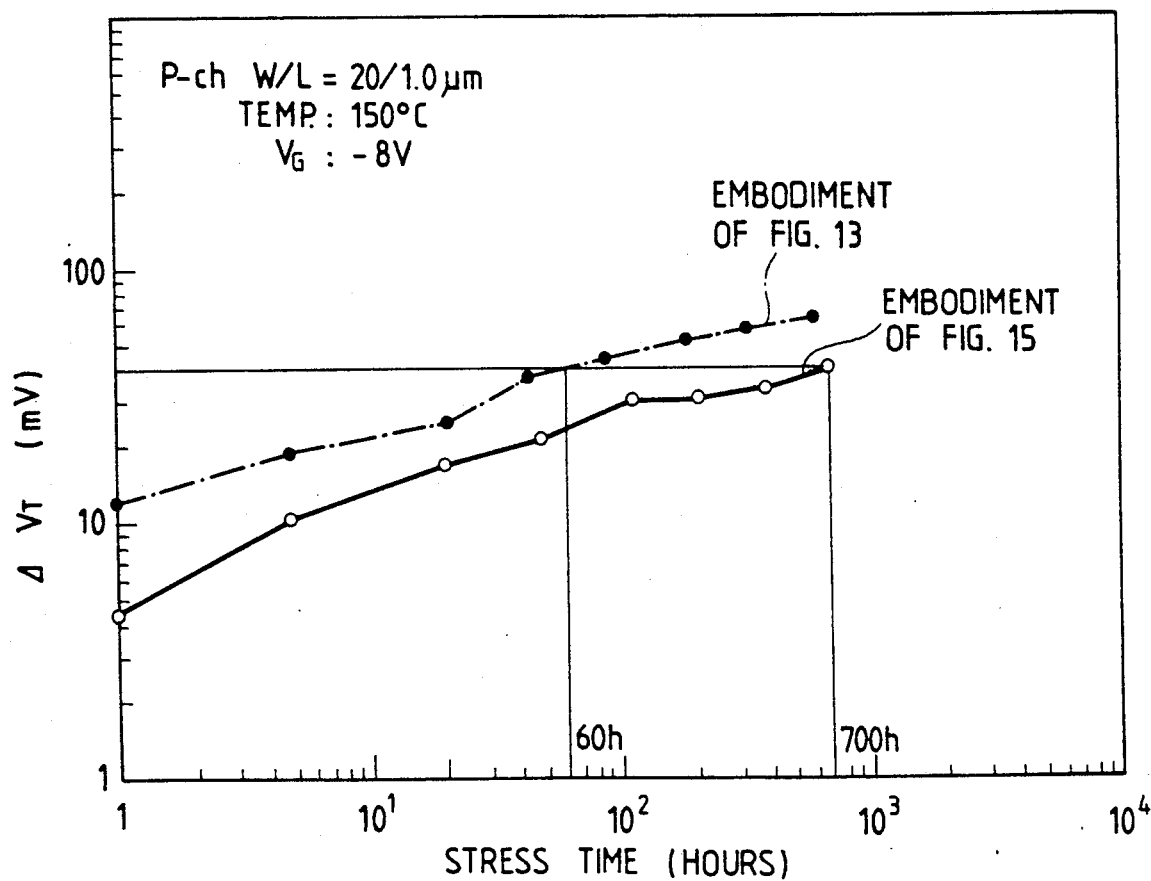
FIG. 16 is a diagram showing the relation between the threshold voltage variation and the stress time in PMOS transistors fabricated by the method of the embodiment of FIGS. 13(a) to 13(h) and the method of the embodiment of FIGS. 15(a) to 15(c).

BT (bias temperature) tests for the measurement of reliability were performed on PMOS transistors fabricated by the method of this embodiment and the method of the embodiment of FIG. 13. Stress conditions were as follows: the temperature was 150° C.; and the gate voltage was −8 V. The PMOS transistors had a gate length of 1.0 μm, a gate width of 20 μm, and a gate oxide film thickness of 16 nm. FIG. 16 shows the results of the experiments. As shown in FIG. 16, the threshold voltage variation ΔVt of the PMOS transistors formed by the method of this embodiment was smaller than that of the PMOS transistors formed by the method of the embodiment of FIG. 13 at equal stress times. For example, at a threshold voltage variation ΔVt of 40 mV, the stress time of the PMOS transistors formed by this embodiment was about 700 hours while the stress time of the PMOS transistors formed by the embodiment of FIG. 13 was about 60 hours. Thus, the life of the PMOS transistors formed by this embodiment was longer than the life of the PMOS transistors formed by the embodiment of FIG. 13 by one order.

What is claimed is:

1. A method of fabricating a semiconductor device, comprising the steps of:
    forming a gate oxide film on a semiconductor substrate;
    forming a gate electrode on the gate oxide film;
    implanting first ions into the substrate to form an LDD layer in the substrate;
    forming a resist pattern covering the gate electrode; and
    implanting second ions into the substrate to form source and drain regions containing the LDD layer;
    wherein said resist pattern prevents the gate electrode from being exposed to ion implantation during the second ion implanting step so that channeling is prevented from occurring in the gate electrode.

2. A method of fabricating a semiconductor device, comprising the steps of:
    forming a gate oxide film on a semiconductor substrate;
    forming a gate electrode on the gate oxide film;
    forming a first protective film on the gate electrode;
    implanting first ions into the substrate to form an LDD layer in the substrate;
    removing the first protective film;
    forming walls around the gate electrode after said removing step;
    forming a second protective film on the gate electrode after said wall-forming step; and
    implanting second ions into the substrate to form source and drain regions in the substrate;
    wherein said first protective film prevents the gate electrode from being exposed to ion implantation during the first ion implanting step and said second protective film prevents the gate electrode from being exposed to ion implantation during the second ion implanting step so that channeling is prevented from occurring in the gate electrode.

3. The method of claim 2 wherein each of said steps of forming the first protective film and the second protective film comprises forming an amorphous film on the gate electrode.

4. The method of claim 2 wherein each of said steps of forming the first protective film and the second protective film comprises forming a thermally oxidized film on the gate electrode.

5. A method of fabricating a semiconductor device comprising the steps of:
    forming a gate oxide film on a semiconductor substrate;
    forming a gate electrode on the gate oxide film;
    forming a first protective film on the gate electrode;
    implanting first ions into the substrate to form an LDD layer in the substrate, wherein said first protective film prevents the gate electrode from being exposed to ion implantation during said first ion implantating step so that channeling is prevented from occurring in the gate electrode;
    removing the first protective film;
    forming walls around the gate electrode after said removing step;
    implanting second ions into the substrate to form source and drain regions of a PMOS transistor in the substrate;
    forming a second protective film on the gate electrode after said second ion implanting step; and
    implanting third ions into the substrate to form source and drain regions of an NMOS transistor in the substrate, wherein said second protective film prevents the gate electrode from being exposed to ion implantation during the third ion implanting step so that channeling is prevented from occurring in the gate electrode.

6. The method of claim 5 wherein each of said steps of forming the first protective film and the second protective film comprises forming an amorphous film on the gate electrode.

7. The method of claim 5 wherein each of said steps of forming the first protective film and the second protective film comprises forming a thermally oxidized film on the gate electrode.

* * * * *